(12) United States Patent
Lynch et al.

(10) Patent No.: US 10,847,857 B2
(45) Date of Patent: Nov. 24, 2020

(54) METHOD AND APPARATUS FOR INTEGRATED SHIELDED CIRCULATOR

(71) Applicant: HRL Laboratories, LLC, Malibu, CA (US)

(72) Inventors: Jonathan J. Lynch, Oxnard, CA (US); Florian G. Herrault, Malibu, CA (US)

(73) Assignee: HRL Laboratories, LLC, Malibu, CA (US)

( * ) Notice: Subject to any disclaimer, the term of this patent is extended or adjusted under 35 U.S.C. 154(b) by 14 days.

(21) Appl. No.: 16/396,074

(22) Filed: Apr. 26, 2019

(65) Prior Publication Data
US 2020/0006833 A1    Jan. 2, 2020

Related U.S. Application Data

(60) Provisional application No. 62/691,885, filed on Jun. 29, 2018.

(51) Int. Cl.
| | | |
|---|---|---|
| H01P 1/38 | (2006.01) | |
| H01P 11/00 | (2006.01) | |
| H01P 3/08 | (2006.01) | |
| H01L 23/66 | (2006.01) | |
| H01P 3/00 | (2006.01) | |

(52) U.S. Cl.
CPC ............ *H01P 1/38* (2013.01); *H01L 23/66* (2013.01); *H01P 3/003* (2013.01); *H01P 3/08* (2013.01); *H01P 3/081* (2013.01); *H01P 11/003* (2013.01); *H01L 2223/6627* (2013.01)

(58) Field of Classification Search
CPC .. H01P 3/003; H01P 3/08; H01P 3/081; H01P 1/38; H01P 1/36; H01P 1/383; H01P 1/387; H01P 1/39; H01P 1/32; H01P 11/001; H01P 11/003; H01P 11/007; H01P 1/19
USPC .................................................. 333/1.1, 24.2
See application file for complete search history.

(56) References Cited

U.S. PATENT DOCUMENTS

| | | |
|---|---|---|
| 6,894,579 B2 | 5/2005 | Brown |
| 2002/0093392 A1 | 7/2002 | Ohata |
| 2017/0133141 A1 | 5/2017 | Cruickshank |

(Continued)

FOREIGN PATENT DOCUMENTS

WO    2018-093771 A1    5/2018

OTHER PUBLICATIONS

PCT International Search Report and Written Opinion from PCT/US2019/029502 dated Aug. 9, 2019.

(Continued)

*Primary Examiner* — Stephen E. Jones
(74) *Attorney, Agent, or Firm* — Ladas & Parry

(57) ABSTRACT

An RF circulator in combination with a RF integrated circuit, the RF integrated circuit having a plurality of RF waveguide or waveguide-like structures in or on the RF integrated circuit, the RF circulator comprising a disk of ferrite material disposed on a metallic material disposed on or in the RF integrated circuit, the disk of ferrite material extending away from the RF integrated circuit when disposed thereon, the metallic portion having a plurality of apertures therein adjacent the disk of ferrite material which, in use, are in electromagnetic communication with the disk of ferrite material and with the plurality of RF waveguide or waveguide-like structures, the disk of ferrite material being disposed in a metallic cavity.

15 Claims, 11 Drawing Sheets

Side view

Top view

(56) References Cited

U.S. PATENT DOCUMENTS

2018/0166763 A1    6/2018  Cruickshank

OTHER PUBLICATIONS

Bosma, Hl. "On Stripline Y-circulation at UHF," IEEE Trans. Microwave Theory Tech. 12, 61-72 (1964).
Oliver, S. A.. et al., "Integrated Self-Biased Hexaferrite Microstrip Circulators for Millimeter-Wavelength Applications," IEEE Transactions on Microwave Theory and Techniques, vol. 49, No. 2, Feb. 2001.
Pozar, D. M., "Microwave Engineering (Fourth Edition)," John Wiley and Sons, 2012, p. 490.
Rosu, Iulian, "Microstrip, Stripline, and CPW Design" by publishd at https://www.qsl.net/va3iul/Microstrip_Stripline_CPW_Design/Microstrip_Stripline_and_CPW_Design.pdf.
PCT International Preliminary Report on Patentability (Chapter II) from PCT International Preliminary Report on Patentability (Chapter II) dated Aug. 4, 2020 (42 pages).

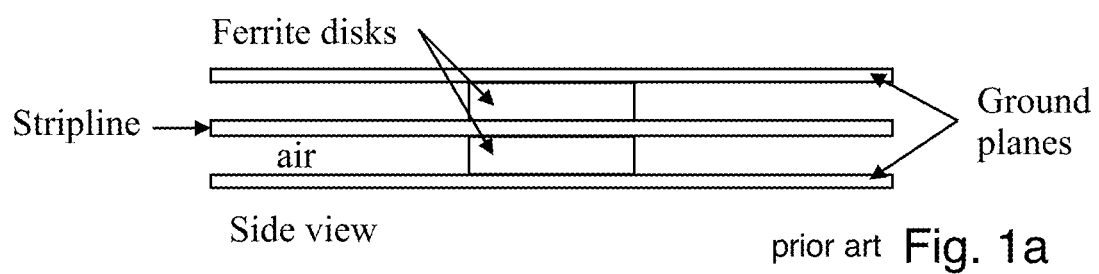
prior art Fig. 1a
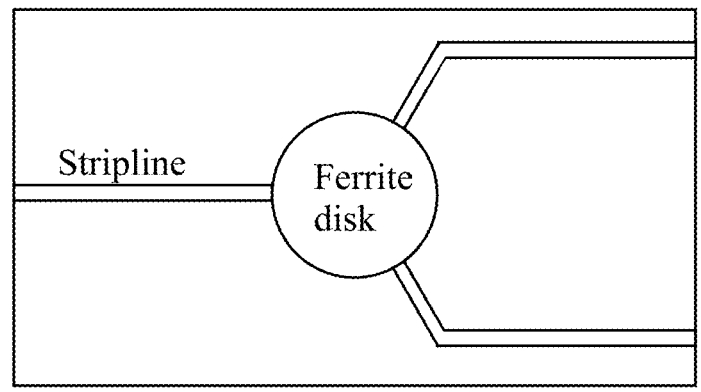
prior art Fig. 1b

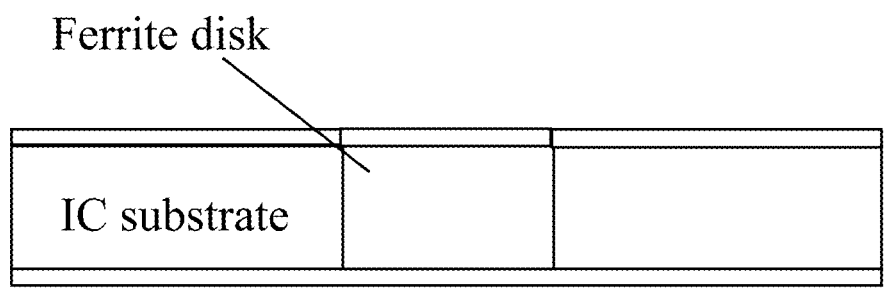
Side view
prior art Fig. 2a
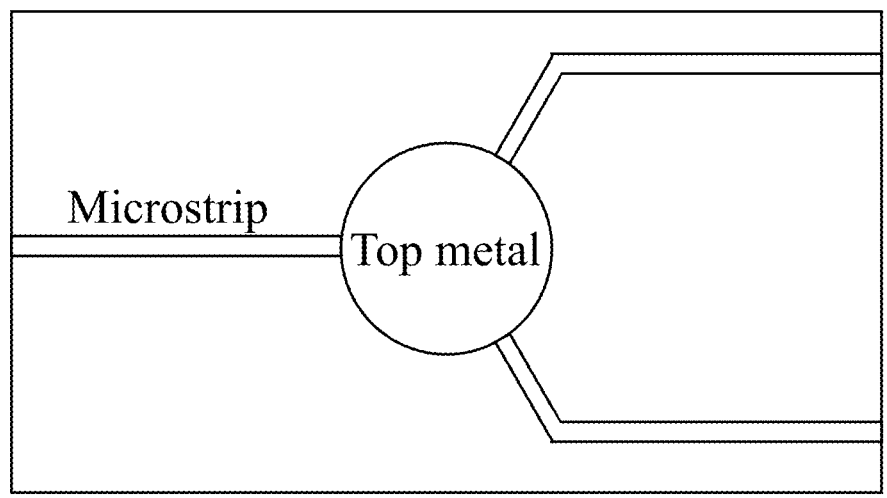
Top view
prior art Fig. 2b

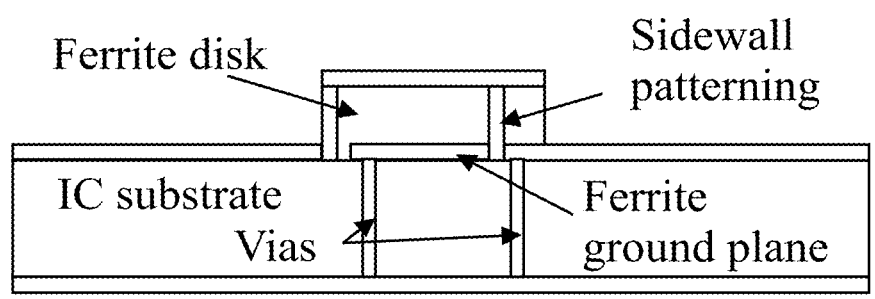
Side view
prior art Fig. 3a
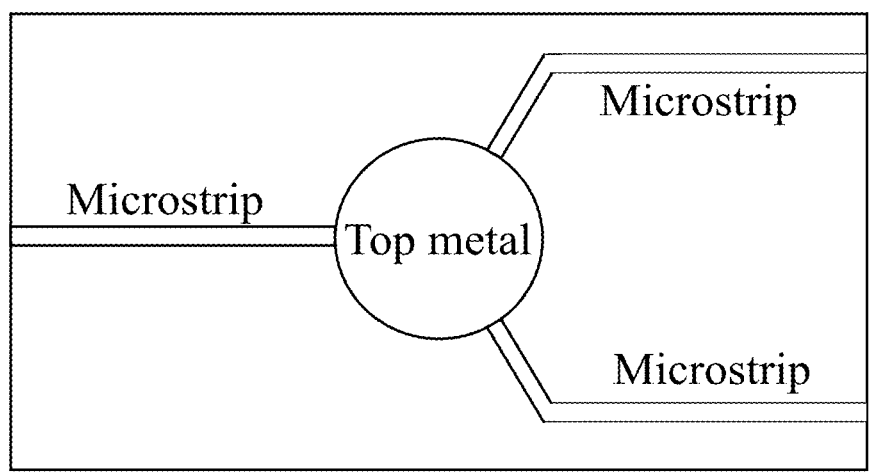
Top view
prior art Fig. 3b

Side view

Top view

Side view

Top view

Top view

METHOD AND APPARATUS FOR INTEGRATED SHIELDED CIRCULATOR

CROSS REFERENCE TO RELATED APPLICATIONS

This application claims the benefit of U.S. Provisional Patent Application Ser. No. 62/691,885 filed 29 Jun. 2018 and entitled "Method and Apparatus for Integrated Shielded Circulator", the disclosure of which is hereby incorporated herein by reference.

STATEMENT REGARDING FEDERALLY SPONSORED RESEARCH OR DEVELOPMENT

This is invention was made under US Government Contract No. W911NF-17-C-0023 and therefore the US Government may have certain rights in this invention.

TECHNICAL FIELD

The present description describes a circulator apparatus that may be integrated directly onto conventional RF integrated circuits (ICs) by depositing a ferrite film on the top (or bottom) of the IC substrate and depositing and patterning metal on the ferrite film.

BACKGROUND

Circulators provide an important function for radar, communication, and electronic warfare systems by allowing for a single antenna to be utilized for both transmit and receive. Those skilled in the art appreciate that the circulator function is inherently non-reciprocal, which requires non-reciprocal materials and/or electronics to implement. Magnetic materials such as ferrites exhibit non-reciprocal behavior and have provided the primary means for implementing circulators for decades. Unfortunately, conventional ferrite based circulators are bulky and require permanent magnetic for magnetic bias fields and therefore cannot be integrated directly onto ICs. The present invention takes advantage of new ferrite materials that can be deposited onto ICs and do not require permanent magnets due to their high internal fields (these are typically called "self-biased" because they do not require external magnetic bias field). The presently disclosed technology teaches how to utilize these ferrite materials advantageously to obtain a circulator function on an IC in a manner that is compatible with IC fabrication processes and results in very low radiation losses.

The presently disclosed technology provides an alternative to conventional ferrite disk resonators that are typically implemented in stripline and utilize permanent magnets. A classic example is given by H. Bosma, "On Stripline Y-circulation at UHF," *IEEE Trans. Microwave Theory Tech.* 12, 61-72 (1964), the disclosure of which is hereby incorporated herein by reference.

A stripline, which consists of a strip of metal residing midway between two ground planes, is a convenient radio frequency (and more particularly microwave) transmission medium for ferrite resonators because the E fields have even symmetry about the center conductor, which prevents power from radiating into parallel plate modes and increasing losses. A somewhat less efficient radio frequency (and more particularly microwave) transmission medium is the microstrip which utilizes only a single ground plane (but may employ a second ground plane if desired), but is otherwise similar to a stripline. Another transmission medium for radio frequency (and more particularly microwave) signals is a coplanar waveguide (CPW).

Striplines, microstrips and coplanar waveguides (CPWs) are described in a paper entitled "Microstrip, Stripline, and CPW Design" by Iulian Rosu published at www.qsl.net/va3iul/Microstrip_Stripline_CPW_Design/Microstrip-_Stripline_and_CPW_Design.pdf and which paper is hereby incorporated herein by reference.

Stripline-based ferrite devices are not compatible with conventional IC processing since it would require burying the ferrite material between semiconductor and metal layers. FIGS. 1a and 1b show side elevational and top down illustrations of a stripline based circulator of a type known in the art. See also the article by H. Bosma cited above and the textbook by D. M. Pozar cited below.

There are some recent papers that describe IC-compatible circulators, but they require creating a cavity in the IC substrate layers and filling the cavity with ferrite material in order to couple to the cavity using conventional microstrip traces. Such a structure is illustrated in FIGS. 2a and 2b. An example of a paper that describes such a circulator is S. A. Oliver, et al., "Integrated Self-Biased Hexaferrite Microstrip Circulators for Millimeter-Wavelength Applications," *IEEE Transactions on Microwave Theory and Techniques*, Vol. 49, No. 2, February 2001.

Microstrip-compatible circulators described in the literature consist of a disk of ferrite residing on a ground plane with a metal disk on the top, as shown in FIGS. 1a thru 2b. This structure forms a resonator whose resonant mode, typically the fundamental mode, has a high value of electric field and low value of magnetic field at the edge. The top conductor is connected to three microstrip lines (or CPW lines) located symmetrically about the structure (i.e., at 120 deg intervals) that couple power into and out of the resonator. It is inherently difficult to fabricate the structure of FIGS. 1a-2b using standard IC processes. Either one must create a cavity in the IC, deposit the ferrite into the cavity, and then make the microstrip connections. Or alternatively, one may deposit the ferrite on the IC surface (which is much easier) but then deposit and pattern metal on the ferrite surface. This patterning is difficult because it requires patterning and etching the metal on the sidewalls of the ferrite disk to obtain open sidewalls except for a thin microstrip line running down the side. One must also electrically connect the ferrite ground electrode to the ground plane of the IC through vias. Such as structure is illustrated in FIGS. 3a and 3b. See also the paper by S. A. Oliver, et al., cited above.

The presently disclosed technology improves upon the above prior techniques by depositing the ferrite film, preferably utilizing an aqueous solution, on the top or bottom of the IC surface, thereby not requiring the etching of a cavity, covering the ferrite disk with metal, and then coupling into the device using electromagnetic apertures. Additionally, this present invention offers greater design flexibility since the ferrite material can be of any thickness (1 micron to 500 microns for example) while substrate-integrated ferrite disk thicknesses are set by the substrate thickness (which is, in turn, determined by RF design considerations).

Additionally, another aspect of the novelty of this disclosure is that it utilizes a different resonant mode than conventional circulators, allowing the ferrite resonator to be shielded by metal to avoid radiation losses as well as allowing for aperture coupling to the ferrite resonator, which is convenient for IC integration.

The presently disclosed technology is potentially useful for automotive radar, which currently requires two antennas, by allowing automotive radar to operate with only one antenna.

This presently disclosed technology is also useful for radar and communication systems. It reduces the size and complexity of millimeter wave systems by shrinking the size of the circulator and integrating it directly onto the front-end ICs. It also facilitate the packaging of millimeter wave array elements, allowing them to fit within half wavelength square areas.

BRIEF DESCRIPTION OF THE INVENTION

In one aspect, the present invention provides an apparatus comprising: an integrated circuit substrate, the substrate having a region upon which metal is disposed, said metal having a plurality of apertures therein, each of said apertures being associated with and, in use, in electromagnetic communication with a corresponding waveguide or waveguide-like structure also disposed (i) on or in said integrated circuit substrate or (ii) on or in the metal disposed on said region; a disk of ferrite material disposed above or below said integrated circuit substrate adjacent the region upon which metal is disposed and on, over or under the apertures in the region of metal; and metallic material substantially encapsulating the disk of ferrite material.

In another aspect, the present invention provides an RF circulator in combination with a RF integrated circuit, the RF integrated circuit having a plurality of RF waveguide or waveguide-like structures in or on said RF integrated circuit, the RF circulator comprising a body or disk of ferrite material disposed on a metallic material disposed on or in said RF integrated circuit, the body or disk of ferrite material extending away from the RF integrated circuit when disposed thereon, metallic material encapsulating a majority of an exterior surface of the body or disk of ferrite material extending away from the RF integrated circuit, the encapsulating metallic material having a plurality of apertures therein adjacent said body of ferrite material which, in use, are in electromagnetic communication with said body of ferrite material and with the plurality of RF waveguide or waveguide-like structures.

In yet another aspect, the present invention provides a method of making an RF circulator on a RF integrated circuit substrate, the RF integrated circuit substrate having a plurality of RF waveguide or waveguide-like structures formed thereon or therein. The method includes applying a first photoresist on said RF integrated circuit substrate, the photoresist being patterned to form a mold defining exterior sidewalls of magnetic material of the RF circulator to be formed; immersing at least the mold with an aqueous solution containing magnetic nano (micro) particles, preferably of BaFeO or SrFeO material and setting a pH of the aqueous solution such that the surface charge on the magnetic nano (micro) particles causes repulsive forces between the particles thereby allowing the particles to be suspended in the solution. The pH of the aqueous solution is controllably changed to reduce the surface charge, therefore favoring particle agglomeration and deposition on said RF integrated circuit substrate. Then the first photoresist is removed and a second photoresist is applied on said RF integrated circuit substrate, the second photoresist being patterned to cover areas of said RF integrated circuit substrate adjacent the deposited magnetic nano (micro) particles on said RF integrated circuit substrate thereby exposing at least a majority of an exposed surface area of the deposited magnetic nano (micro) particles to further processing. Then an encapsulating metal is deposited or otherwise formed on the exposed surface area of the deposited magnetic nano (micro) particles. Then the second photoresist is removed.

BRIEF DESCRIPTION OF THE DRAWINGS

FIGS. 1a and 1b are a side elevational view and a top view of a prior art stripline circulator consisting of two ferrite disks with a circular metallic disk in between, sandwiched symmetrically between two ground planes. The even symmetry of the fields prevents parallel plate mode radiation. A permanent magnet (not shown) may be placed on top of the disk to create a magnetic bias field.

FIGS. 2a and 2b are a side elevational view and a top view of a prior art depiction of a ferrite disk residing in a cavity. Technical papers on microstrip circulators require the ferrite to reside in a cavity so that the microstrip may be formed by straightforward metal deposition and patterning.

FIGS. 3a and 3b are a side elevational view and a top view of another prior art design for a microstrip circulator where the ferrite is deposited on top of the IC substrate, but this requires etching on the sidewalls of the ferrite to create microstrip feed lines, and vias must also connect the ferrite ground to the IC ground plane as shown.

FIG. 4a-1 is a side view and FIG. 4a-2 is a top down view of a microstrip embodiment (with rectilinear coupling apertures), while FIG. 4a-3 is a top down view of an alternative microstrip embodiment (with curved coupling apertures) of the presently disclosed technology.

FIG. 4b-1 is a side view, FIG. 4b-2 is a top down view and FIG. 4b-3 is a side elevational view (taken along section lines labeled 4b-3 on FIGS. 4b-1 and 4b-2) of a CPW embodiment of the presently disclosed technology.

FIGS. 6a-1 and 6a-2 depict two different embodiments of the presently disclosed technology (each in top down views) of a microstrip aperture coupling to the ferrite disk.

FIG. 6a-3 is a side elevational view taken along a section line labeled 6a-3 on FIG. 6a-2.

FIGS. 6b-1 and 6b-2 depict two different embodiments of the presently disclosed technology (in a top down view) of a CPW aperture coupling to the ferrite disk. In these embodiments the aperture resides in the ground plane of the transmission line, which is in the same plane as the CPW trace. The CPW line may be terminated in a short (see FIG. 6b-1) or as a "folded CPW" line (see FIG. 6b-2). These techniques should be well known to those well skilled in the art.

DETAILED DESCRIPTION

Figures 1, 4A:
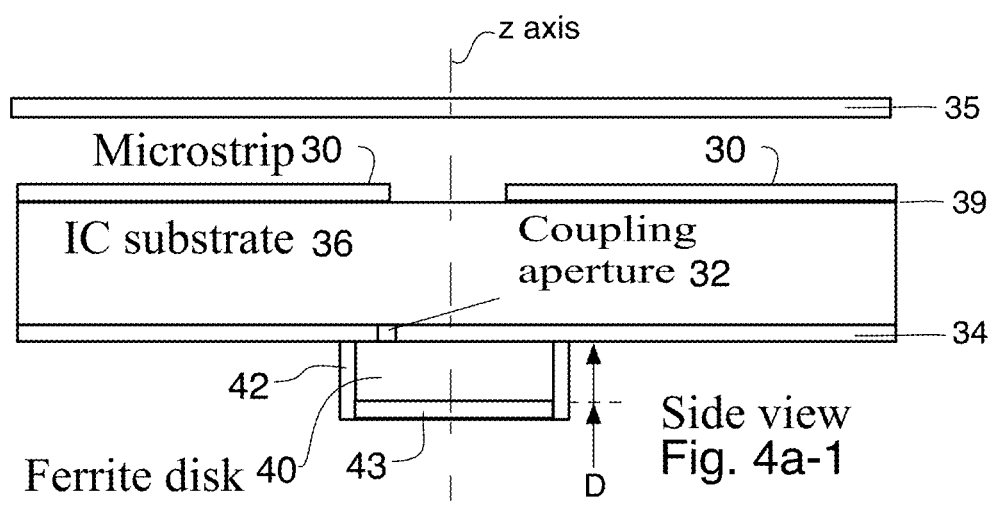

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

This application includes numerous embodiments of a circulator that can be readily integrated within an IC without substantial alterations of conventional semiconductor processing steps. Elements which either are identical or are very similar in function often share the reference numeral between these embodiments to avoid an unnecessary repetition of their descriptions.

The disclosed circulator can be readily integrated within an IC without substantial alterations of conventional semiconductor processing steps. It also reduces spurious radiation, thus reducing the overall insertion loss. These improvements are achieved by shielding the ferrite resonator on all sides with metal, and then coupling into and out of the resonator through coupling apertures. An illustration of one embodiment of this disclosed structure is shown in FIG. 4. RF ICs generally use either microstrip or coplanar waveguide (CPW) to route signals on the chip. Either of these transmission line types may be used to interface to the disclosed ferrite resonator.

Conventional ferrite resonators used in circulators utilize the $TM_{110}$ mode (transverse magnetic to the axial direction), which gives an operating frequency of:

$$f = \frac{0.293}{a\sqrt{\varepsilon\mu_o}} \qquad \text{Eqn. (1)}$$

where a is the radius of the ferrite disk, ε is the permittivity of the ferrite, and $\mu_o$ is the permeability of free space. See D. M. Pozar, "Microwave Engineering (Fourth Edition)," John Wiley and Sons, 2012, p. 490. Thus, for a given operating frequency the foregoing equation may be used to determine (or at least approximate) the radius of the ferrite disk. The above formula was derived assuming that the tangential H field drops to zero at the edge of the disk, which is approximately correct for a disk with open (i.e., non-conducting) sidewalls. As mentioned above, open sidewalls are fine for a stripline design (see FIGS. 1a and 1b) because the even symmetry of the fields about the center conductor prevents energy lost through parallel plate modes. Ferrite resonators with open sidewalls that are integrated onto the surface of an IC will suffer radiation losses, and the degree of the losses depend on the specific parameters for a given design.

The presently disclosed technology addresses the radiation loss issue by shielding the ferrite disk through encapsulating it with metallic sidewalls 42 and top or bottom surfaces 43, and a ground plane 35. See, for example, FIGS. 4a-1 and 4a-2 and/or FIGS. 4b-1 and 4b-2. If the entire ferrite disk 40 is coated with encapsulating metal with the only openings in the encapsulating metal preferably being the apertures 32, 37 for making EM connections to striplines (which are also called microstrips) 30 (as in the case of the embodiment of FIGS. 4a-1 and 4a-2) or for making EM connections to CPWs 31 (as in the case of the embodiment of FIGS. 4b-1 and 4b-2), the resulting cavity possesses resonant modes that are also TM to the axial (z) direction, but the boundary condition at the edge of the disk changes. The mode of interest is again the $TM_{110}$ mode, but the change in boundary condition (from non-conducting sidewalls to metallic sidewalls 42) gives an operating frequency of:

$$f = \frac{0.610}{a\sqrt{\varepsilon\mu_o}}. \qquad \text{Eqn. (2)}$$

where a is again the radius of the ferrite disk, ε is the permittivity of the ferrite, and $\mu_o$ is the permeability of free space. Comparing the radius variables in Eqn. (1) and Eqn. (2), tells us that the radius of the disk for the metal coated disk is about $$\frac{0.610}{0.293}$$

or roughly twice the size of a disk without metallic sidewalls for a given operating frequency. So, although this metal coated disk is larger than the conventional design (for a given operating frequency), the improved performance due to a reduction of radiation losses is often worth the tradeoff.

Figures 2, 4A:
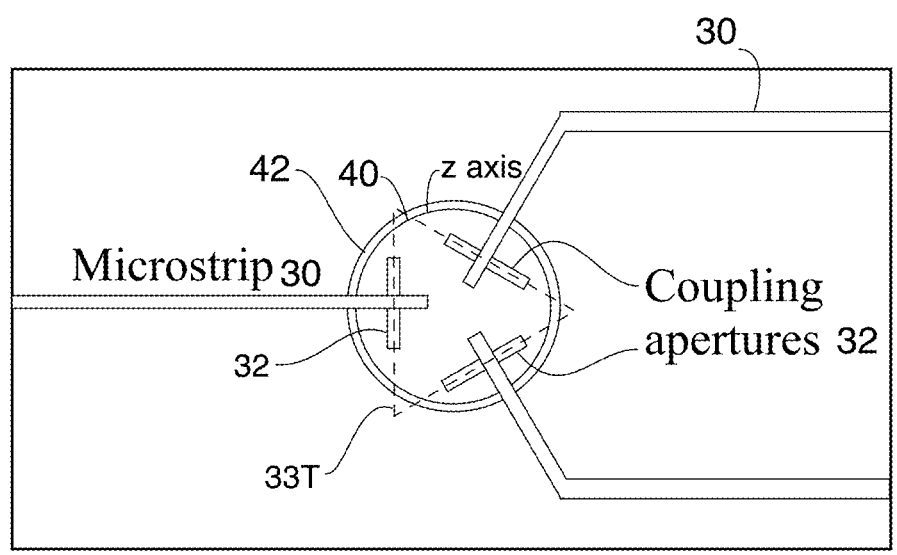
Figures 1, 4B:
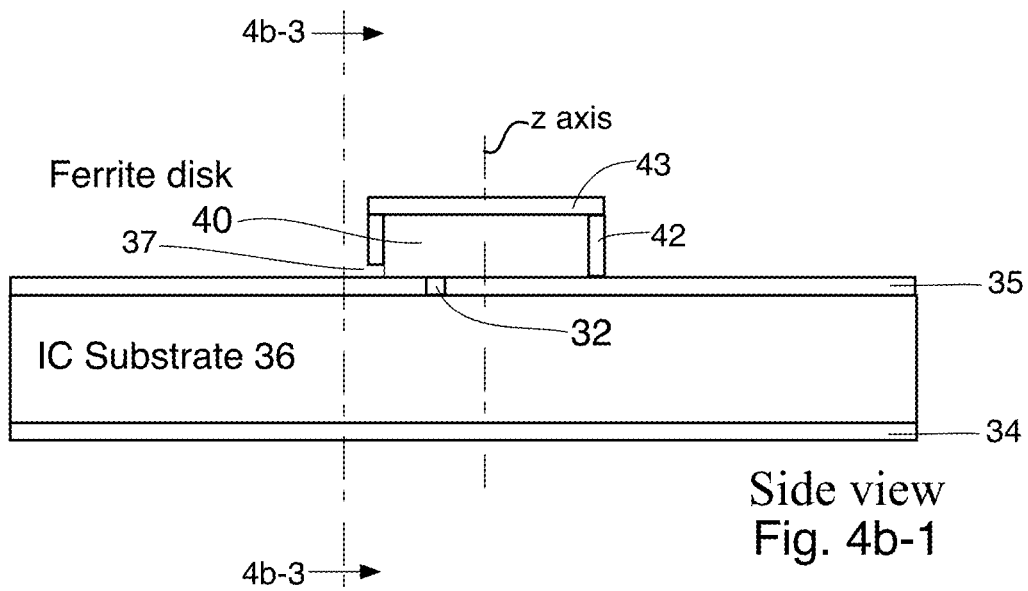
Figures 2, 4B:
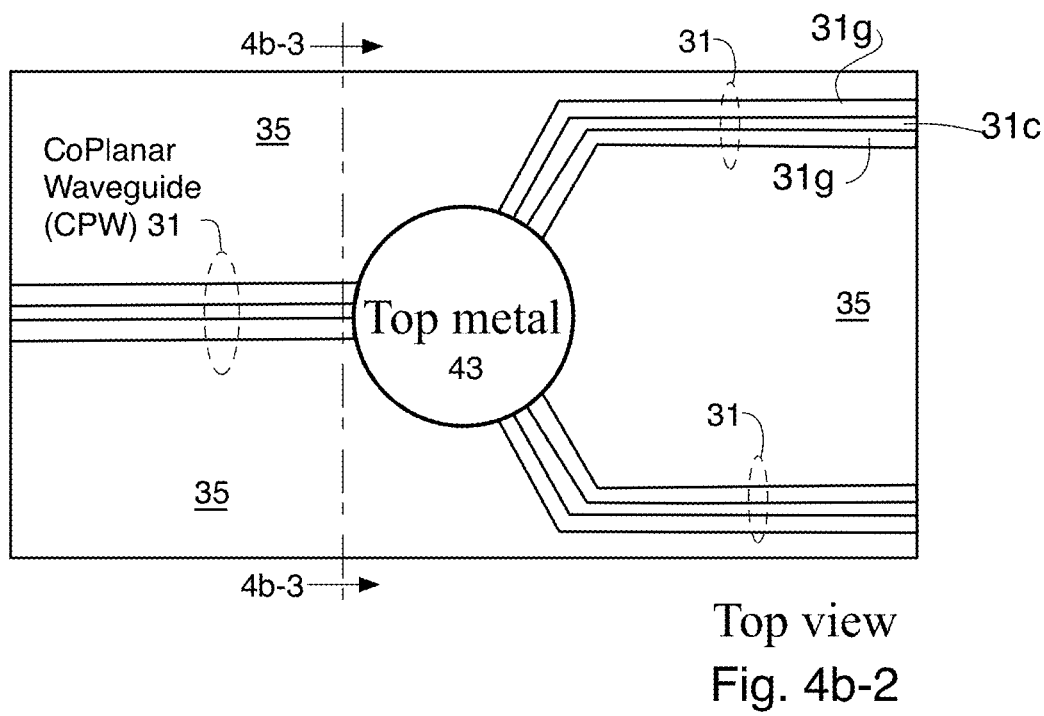
Figures 3, 4A:
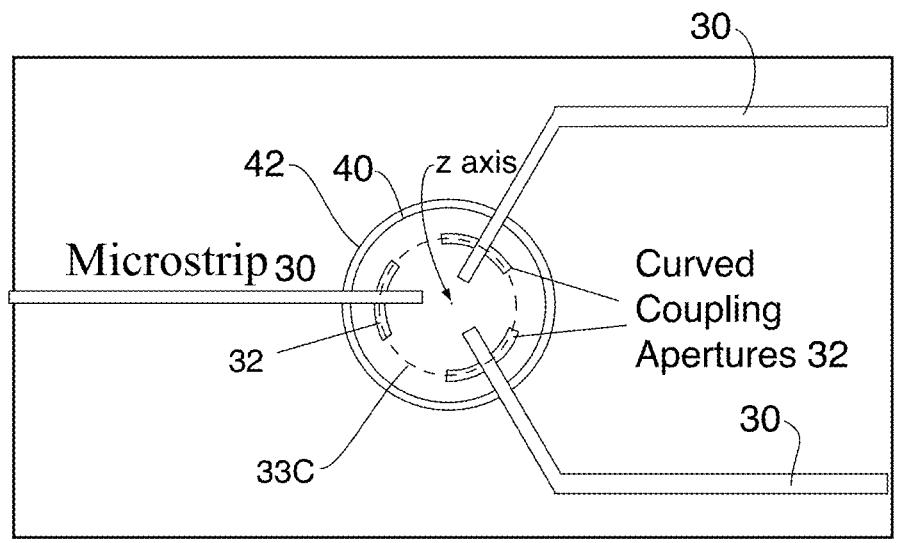
Figures 3, 4B:
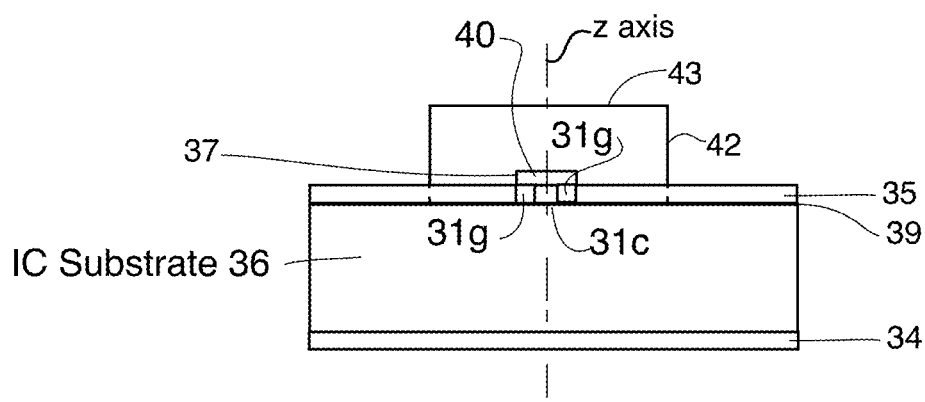

FIG. 4a-1 is a side view and FIG. 4a-2 is a top down view of a microstrip embodiment (with rectilinear coupling apertures) of the presently disclosed technology, while FIG. 4a-3 is a top down view of a microstrip embodiment (with curved coupling apertures) of the presently disclosed technology invention. FIG. 4b-1 is a side view and FIG. 4b-2 is a top down view of a CPW embodiment of the presently disclosed technology. FIG. 4b-3 is a side elevation view (taken along section lines labeled 4b-3 in FIGS. 4b-1 and 4b-2) of a CPW embodiment of the presently disclosed technology. The ferrite disk 40 is located on either the top or bottom of the IC substrate 36, for either a microstrip or a CPW embodiment, whichever is more convenient. The ferrite disk 40 of the resonator is preferably completely shielded by metal except for apertures 32 to couple energy in and out of it and an opening 37 allowing the CPW 31 to pass the metallic sidewall 42 without shorting it to ground plane 34.

The thickness D of the ferrite disk 40 may be of almost any thickness, but generally speaking, a thicker ferrite 40 will be better than a thinner disk, taking into consideration the following caveats: (i) a thicker disk will usually be more difficult to manufacture and (ii) if the disk is too thick it will excite higher order modes, which will begin at about a half wavelength in thickness. So the thickness D of the ferrite disk 40 is preferably less than one half wavelength of the frequency at which the circulator in which is it used is intended to operate.

Aperture 32 coupling is a convenient way to couple energy into and out of the metal sidewall shielded resonator, and the larger radius of a metal encapsulated disk has the added benefit of allowing for slots large enough for efficient energy coupling. It is well known to those skilled in the art that coupling apertures 32 must be sufficiently large, as compared to a wavelength, to efficiently couple energy over a reasonable bandwidth. A rectangular slot whose length is approximately half a wavelength (for the equivalent slotline transmission medium) will provide strong coupling. As the slot length is reduced, the coupling becomes weaker. An example of a typical coupling aperture length is 0.4 equivalent wavelengths in the slotline medium. Additionally, the aperture coupling strength may also be increased by moving the apertures 32 closer to the periphery of the disk.

Figure 5:
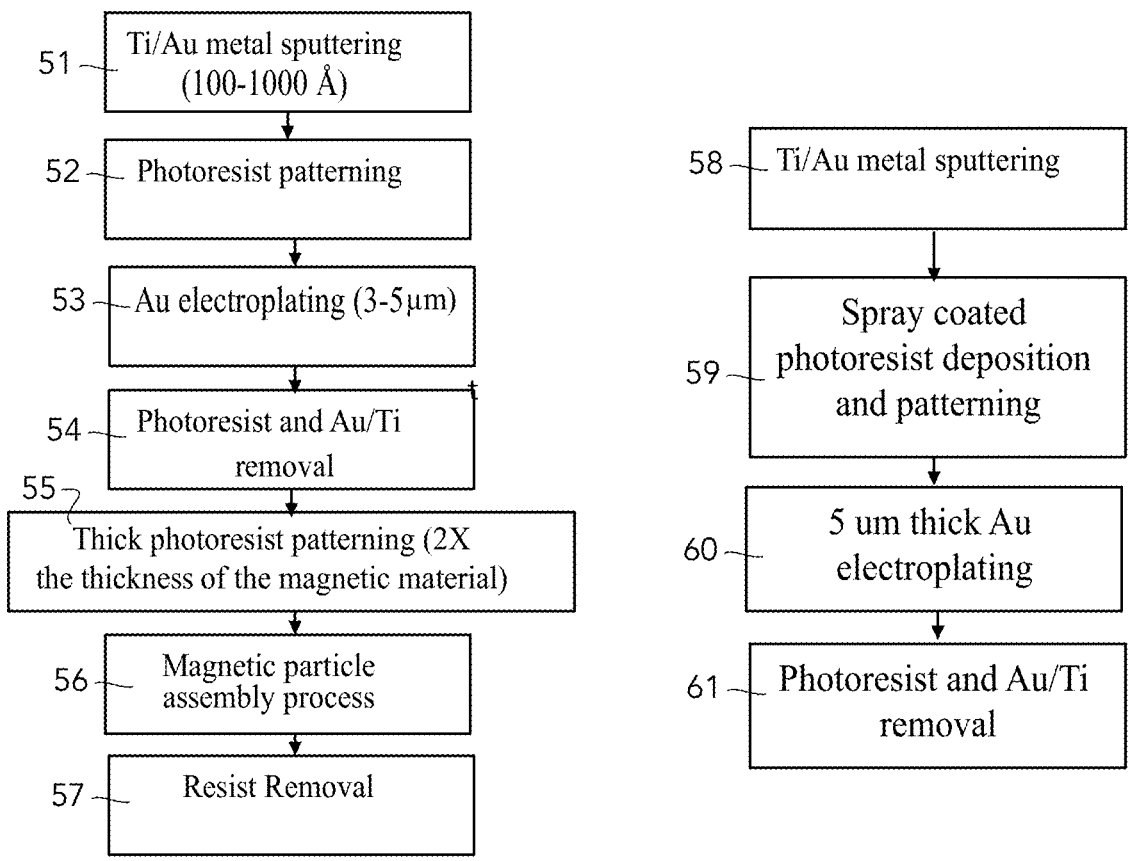
FIG. 5 is a flow chart showing one possible technique for making the CPW embodiment of FIGS. 4b-1 through 4b-3.

The embodiment of FIGS. 4b-1 through 4b-3 may be made as will now be described with reference to the flow chart of FIG. 5. At block 51 a 100 to 1000 Å thick layer of Ti/Au 39 is formed on substrate 36, preferably by sputtering. Next, at block 52, a photoresist is put down and patterned followed by at block 53 electroplating a 3-5 µm layer of Au to define the center conductors 31c of CPWs 31 and ground plane 35. At block 54 the photoresist along with the layer of Ti/Au not covered by the Au are removed. As a result, the conductors 31c located at the center of the CPWs 31 are spaced from the surrounding ground plane 35 by gaps 31g.

At block 55, a thick layer of a photoresist is put down and patterned. This photoresist is preferably about two times as thick (2·D) as the thickness D of the magnetic material 40 which will be formed at block 56. This photoresist is patterned to form a mold for receiving an aqueous solution, the mold defining the exterior shape of the magnetic material 40. The solution contains magnetic nano (micro) particles, preferably of BaFeO or SrFeO material. The pH of the solution is set such that the surface charge on the particles causes repulsive forces between the particles. This allows the particles to be suspended in solution. The pH is then controllably changed to reduce the surface charge, therefore favoring particle agglomeration and deposition on the substrate 36. The particles deposit all over the wafer (in the open area of the mold of the photoresist and on areas covered with photoresist). When the particle assembly process of block 56 is completed, the photoresist on the wafer is removed chemically at block 57, which in turn removes the particles that were on top of the photoresist. The particles that had been deposited on the open areas on the wafer remain as magnetic material 40.

At block 58 a 100 to 1000 Å thick layer of Ti/Au is formed on exposed areas, preferably by sputtering. At block 59 a photoresist is put down and patterned followed by at block 60 electroplating a 3-5 µm layer of Au to define top metal 43 and sidewalls 42. The photoresist put down at block 59 is also patterned to cover where openings 37 will occur in the electroplated Au of sidewalls 42. At block 61 the patterned photoresist formed at block 59 is removed (along with the remaining, exposed Ti/Au).

Figures 1, 6A:
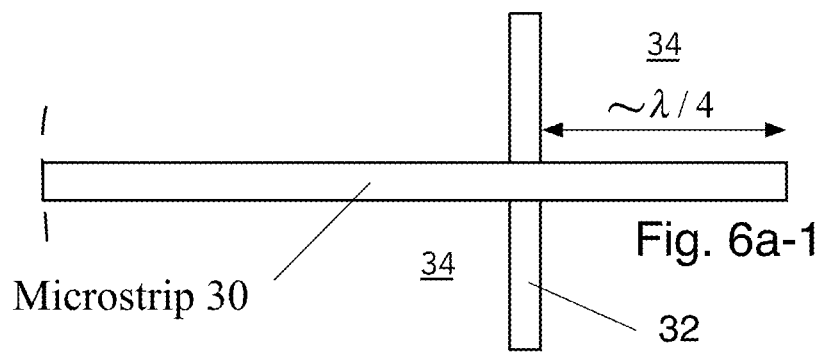
Figures 2, 6A:
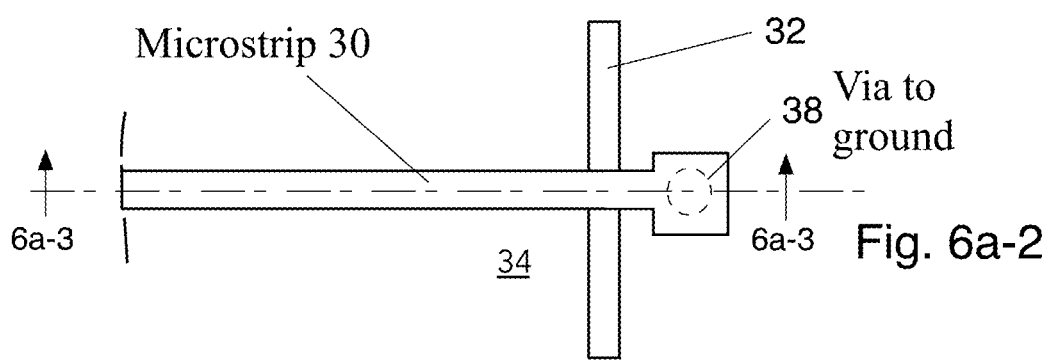
Figures 3, 6A:
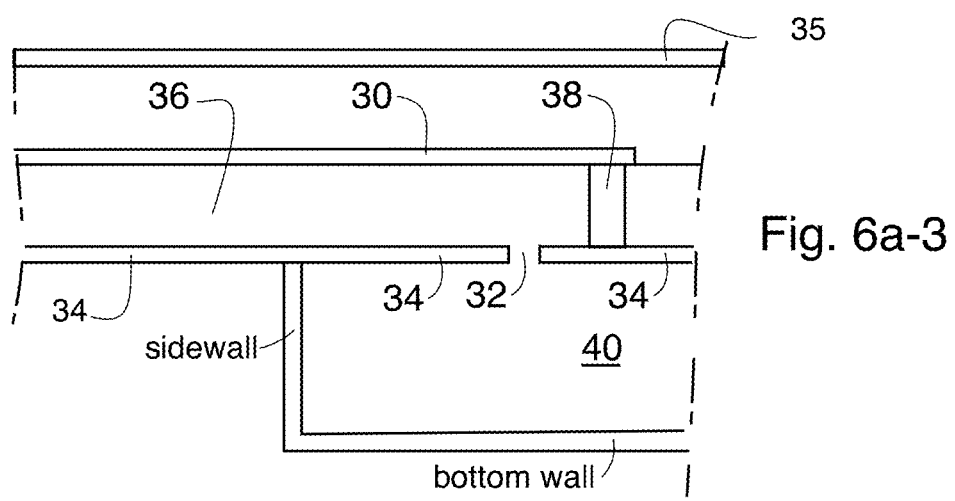
Figures 1, 6B:
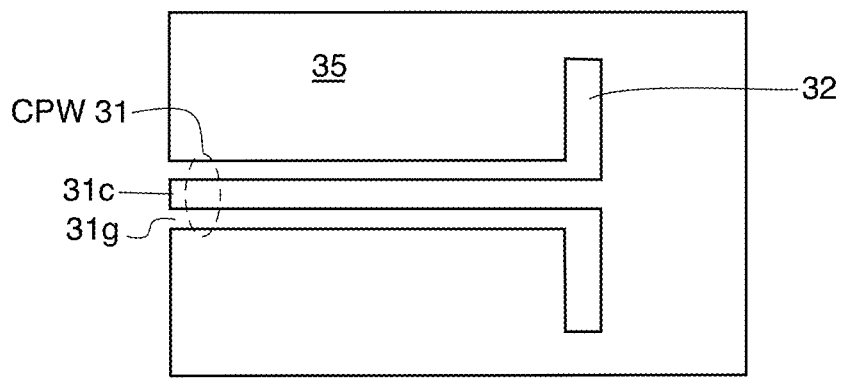
Figures 2, 6B:
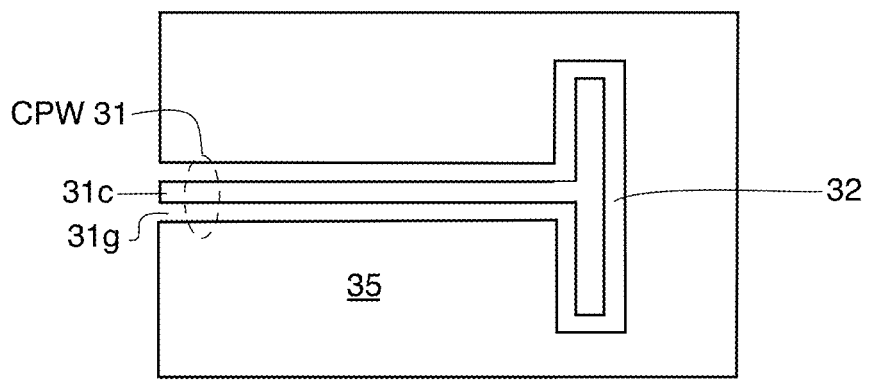

FIGS. 6a-1 and 6a-2 depict two different embodiments (each in top down views) of a microstrip aperture coupling to the ferrite disk 40 while FIGS. 6b-1 and 6b-2 depict two different embodiments (also in a top down views) of a CPW aperture coupling to the ferrite disk 40. Both approaches allow energy to be coupled through apertures 32, and for each case there are multiple ways to implement the structure. For a microstrip embodiment, the aperture resides in the ground plane below the transmission line. The microstrip line 30 may be terminated by a quarter wavelength open circuited ¼ wave stub (see FIG. 6a-1) or with a via 38 (FIG. 6a-1) that shorts it to ground near the slot edge (see FIGS. 6a-2 and 6a-3). FIG. 6a-3 depicts a side elevational view of the embodiment of FIG. 6a-2.

FIGS. 6b-1 and 6b-2 depict two different embodiments (in a top down view) of a CPW aperture coupling to the ferrite disk. In these the aperture resides in the ground plane of the transmission line, which is in the same plane as the CPW trace 31c. The CPW trace line 31c may be terminated in a short (see FIG. 6b-1) or as a "folded CPW" line (see FIG. 6b-2).

FIGS. 6a-1 thru 6b-2 show embodiments of coupling apertures 32 that couple energy from either microstrip (see FIGS. 6a-1 thru 6a-3) or CPW (see FIGS. 6b-1 and 6b-2) to the ferrite resonator 40. A microstrip 30 couples through an aperture 32 in the metal surrounding the ferrite disk, so in this case it is convenient to locate the ferrite resonator 40 below the microstrip line 30 and immediately adjacent ground plane 34. In that way the apertures 32 are located in the ground plane 34 in this embodiment, as can be seen in FIGS. 4a-1, 4a-3 and 4a-3. This is advantageous because the ferrite disk 40 does not use up valuable IC real estate and therefore minimizes IC size and cost. An additional ground plane 35 may be added atop the microstrip lines 30 (with an intervening dielectric layer). If the additional ground plane 35 is utilized, then the microstrip lines 30 may be characterized as striplines 30 instead as opposed to as microstrips 30.

Figure 7:
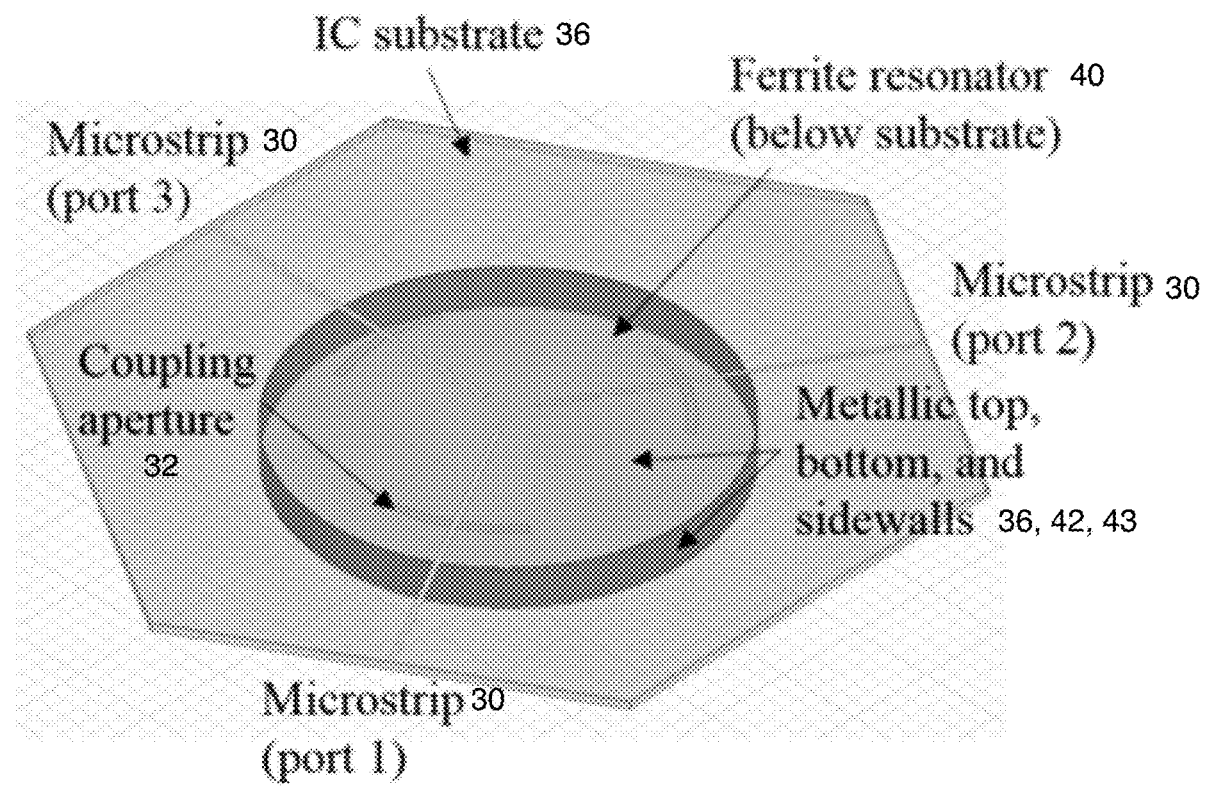
FIG. 7 is a three dimensional depiction of a HFSS model for a simulated microstrip embodiment of the integrated shielded circulator in accordance with the presently disclosed technology.

The apertures 32 may be rectilinear as shown in FIG. 4a-2 or curved as shown in FIG. 4a-3, for the microstrip embodiment (as depicted by those figures) or for the CPW embodiment (discussed above, for example, with reference to FIGS. 6b-1 and 6b-2). As will be discussed, when a simulation was run, the apertures 32 were assumed to be curved (see FIG. 7) following a circular path having a common center with the center of the circular metallic walls 42 adjacent the ferrite disk 40.

The ground plane 35 for CPW embodiment (see FIGS. 4b-1 through 4b-3) is located in the same plane as the metallic CPW traces 31, so in this case it is natural to locate the ferrite resonator 40 above the CPW traces 31, as is depicted in the aforementioned figures. An opening 37 may be provided in the metallic sidewall 42 where the CPW trace enters the metallic cavity formed by metal 35, 42 and 43 surrounding the ferrite disk 40.

Either of these techniques, microstrip or CPW, may be utilized, with the selection depending on the details of the IC design and packaging. Of course, the two basic techniques described herein, (i) microstrip and/or stripline and (ii) CPW, could be combined in a single embodiment if that were desirable in some application.

The three mircostrip lines 30 of FIGS. 4a-2 and 4a-3 are each coupled (at least in an electromagnetic sense) to a separate one of three coupling apertures 32 in the ground plane 34. The three coupling apertures 32 are each of the same size and each preferably has a uniform width. The three mircostrip lines 30 preferably approach the center of disk 40 at a 120° angle with respect to each other. The centerlines of the three coupling apertures 32 preferably define either an equilateral triangle 33T (as shown in FIG. 4a-2 by dashed lines) or a circle 33C (as shown in FIG. 4a-3 by dashed lines) or some other desirable configuration. The sizes of the apertures 32 can be selected by experimentation to optimize them. See, also, in this regard, the simulation discussed below with respect to FIGS. 7 and 8.

To demonstrate this invention we designed a ferrite circulator and simulated it in Ansys High Frequency Structure Simulator (HFSS). FIG. 6 shows the HFSS model for the structure. The ferrite disk 40 in this simulation had a 5 mm diameter and a 0.5 mm thickness D (see FIG. 4*a*-1). The apertures 32 in the ground plane for this simulation were sized 1.4 mm long and 0.1 mm wide, having a curved configuration. The ferrite material parameters were chosen to be: $\mu_r=1$, $\varepsilon_r=15$, $M_s=0.4T$, Lande G factor=1.9, $\Delta H=5000$ A/m, and a uniform axial magnetic bias (self-biased) field of 40,000 A/m. A disk radius of 2.5 mm was chosen for this simulation, which according to Eqn. (2), should produce a resonant frequency of about 19 GHz. The three microstrip lines 30 were located symmetrically around the ferrite disk 40. The microstrip lines 30 in this simulation couple to the resonator through apertures 32 in the ground plane and are terminated with quarter wavelength open circuited stubs (see also FIG. 6*a*-1). The apertures curve (see also FIG. 4*a*-3) along a 45 deg arc and the distance of the apertures from the center (the z-axis) was adjusted to maximize the isolation of the circulator.

Figure 8:
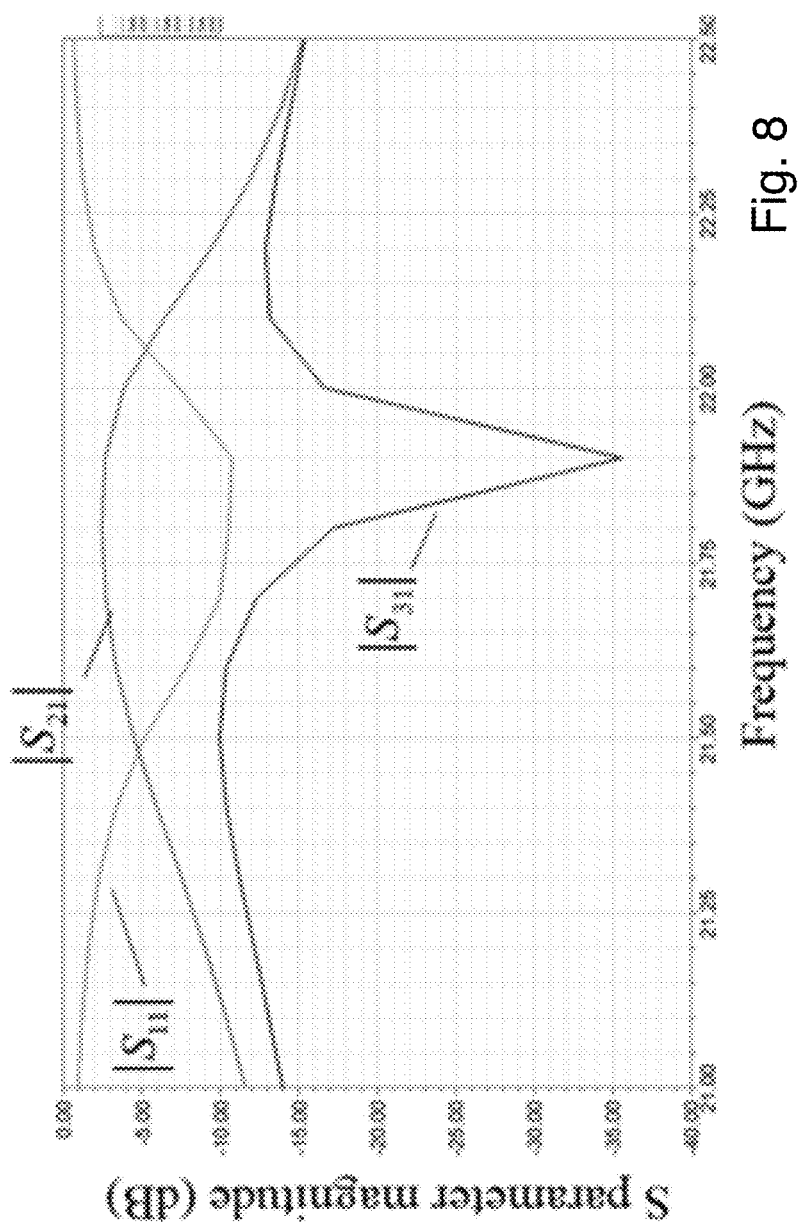
FIG. 8 depicts HFSS simulation results for the device depicted by FIG. 6, indicating an isolation of 35 dB at 21.9 GHz.

The simulated performance of the device is shown in FIG. 8. The peak isolation occurs at 21.9 GHz, which is about 10% higher than the calculated value, and is likely due to the loading of the resonator by the microstrip lines. The return loss is about 10 dB, but this can probably be improved by impedance matching the three inputs/outputs.

The metal used for the microstrip lines 30 and/or the CPW traces 31*c*, for the ground planes and to encapsulate the ferrite disk 40 may be any metal material conveniently used in semiconductor fabrication, such as the Ti and Au metals discussed above.

Ferrite material used for disk 40 typically has a disk shape in the circulator art, but at least conceptually, any convenient shape (or body of ferrite material) may be utilized if it suits the user's needs.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

Concepts disclosed herein include:

Concept 1. An apparatus comprising:
 a. an integrated circuit substrate, the substrate having a region upon which metal is disposed, said metal having a plurality of apertures therein, each of said apertures being associated with and, in use, in electromagnetic communication with a corresponding waveguide or waveguide-like structure also disposed (i) on or in said integrated circuit substrate or (ii) on or in the metal disposed on said region;
 b. a body of ferrite material disposed above or below integrated circuit substrate adjacent the region upon which metal is disposed and on, over or under the apertures in the region of metal; and
 c. metallic material substantially encapsulating the body of ferrite material.

Concept 2. The apparatus of concept 1 wherein there are three, and only three, apertures in the metal associated with a single body of ferrite material and one, and only one, waveguide or waveguide-like structure associated with each of said apertures associated with a single body of ferrite material.

Concept 3. The apparatus of concepts 1 or 2 wherein the corresponding waveguide or waveguide-like structure is selected from the group consisting of microstrips, coplanar waveguides and striplines.

Concept 4. The apparatus of any one of concepts 1-3 wherein the body of ferrite material has a circular shape when viewed from its top down.

Concept 5. The apparatus of concept 4 wherein the apertures have an arcuate shape.

Concept 6. The apparatus of concept 5 wherein centerlines of the apertures are all located on a common circular shape.

Concept 7. The apparatus of concept 6 wherein the centerlines of the apertures are concentric with the circular shape of the body of ferrite material.

Concept 8. The apparatus of any one of concepts 1-3 wherein the apertures have a rectilinear shape.

Concept 9. The apparatus of any one of concepts 1-3 wherein the waveguide or waveguide-like structures are disposed on a first major surface of the integrated circuit substrate and the apertures in the metal occur adjacent a second major surface of the integrated circuit substrate.

Concept 10. The apparatus of any one of concepts 1-3 wherein the waveguide or waveguide-like structures are disposed on a first major surface of the integrated circuit substrate and the apertures in the metal occur adjacent said first major surface of the integrated circuit substrate, and further including a ground plane disposed on a second major surface of the integrated circuit substrate.

Concept 11. An RF circulator in combination with a RF integrated circuit, the RF integrated circuit having a plurality of RF waveguide or waveguide-like structures in or on said RF integrated circuit, the RF circulator comprising a body of ferrite material disposed on a metallic material disposed on or in said RF integrated circuit, the body of ferrite material extending away from the RF integrated circuit when disposed thereon, metallic material encapsulating a majority of an exterior surface of the body of ferrite material extending away from the RF integrated circuit, the encapsulating metallic material having a plurality of apertures therein adjacent said body of ferrite material which, in use, are in electromagnetic communication with said body of ferrite material and with said plurality of RF waveguide or waveguide-like structures.

Concept 12. The RF circulator in combination with a RF integrated circuit of concept 11 wherein a metallic cavity is formed at least in part by said metallic material disposed on or in said RF integrated circuit and said encapsulating metallic material, the body of ferrite material residing in said metallic cavity.

Concept 13. The RF circulator in combination with a RF integrated circuit of concepts 11 or 12 wherein the body of ferrite material is in the form of a body of ferrite material comprising BaFeO and/or SrFeO.

Concept 14. A method of making an RF circulator on a RF integrated circuit substrate, the RF integrated circuit substrate having a plurality of RF waveguide or waveguide-like structures formed thereon or therein, the method comprising:

applying a first photoresist on said RF integrated circuit substrate, the photoresist being patterned to form a mold defining exterior sidewalls of magnetic material of the RF circulator to be formed;

immersing at least the mold with an aqueous solution containing magnetic nano (micro) particles, preferably of BaFeO or SrFeO material and setting a pH of the aqueous solution is set such that the surface charge on the magnetic nano (micro) particles causes repulsive forces between the particles thereby allowing the particles to be suspended in the solution;

controllably changing the pH of the aqueous solution to reduce the surface charge, therefore favoring particle agglomeration and deposition on said RF integrated circuit substrate;

removing the first photoresist;

applying a second photoresist on said RF integrated circuit substrate, the second photoresist being patterned to cover areas of said RF integrated circuit substrate adjacent the deposited magnetic nano (micro) particles on said RF integrated circuit substrate thereby exposing at least a majority of an exposed surface area of the deposited magnetic nano (micro) particles to further processing;

depositing an encapsulating metal on the exposed surface area of the deposited magnetic nano (micro) particles; and removing the second photoresist.

Concept 15. The method of concept 14 further including depositing a layer of metal prior to immersing at least the mold with said aqueous solution so that the magnetic nano (micro) particles are deposited on said layer of metal.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Section 112, as it exists on the date of filing hereof, unless the element is expressly recited using the phrase "means for . . . " and no method or process step herein is to be construed under those provisions unless the step, or steps, are expressly recited using the phrase "comprising the step(s) of . . . ".

Modifications, additions, or omissions may be made to the systems, apparatuses, and methods described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

What is claimed is:

1. An apparatus comprising:
   a. an integrated circuit substrate, the substrate having a region upon which metal is disposed, said metal having a plurality of apertures therein, each of said apertures being associated with and, in use, in electromagnetic communication with a corresponding waveguide or waveguide-like structure also disposed (i) on or in said integrated circuit substrate or (ii) on or in the metal disposed on said region;
   b. a body of ferrite material disposed above or below integrated circuit substrate adjacent the region upon which metal is disposed and on, over or under the apertures in the region of metal; and
   c. metallic material substantially encapsulating the body of ferrite material.

2. The apparatus of claim 1 wherein the waveguide or waveguide-like structures are disposed on a first major surface of the integrated circuit substrate and the apertures in the metal occur adjacent a second major surface of the integrated circuit substrate.

3. The apparatus of claim 1 wherein there are three, and only three, apertures in the metal associated with a single body of ferrite material and one, and only one, waveguide or waveguide-like structure associated with each of said apertures associated with a single body of ferrite material.

4. The apparatus of claim 1 wherein the corresponding waveguide or waveguide-like structure is selected from the group consisting of microstrips, coplanar waveguides and striplines.

5. The apparatus of claim 1 wherein the apertures have a rectilinear shape.

6. The apparatus of claim 1 wherein the waveguide or waveguide-like structures are disposed on a first major surface of the integrated circuit substrate and the apertures in the metal occur adjacent said first major surface of the integrated circuit substrate, and further including a ground plane disposed on a second major surface of the integrated circuit substrate.

7. The apparatus of claim 1 wherein the body of ferrite material has a circular shape when viewed from its top down.

8. The apparatus of claim 7 wherein the apertures have an arcuate shape.

9. The apparatus of claim 8 wherein centerlines of the apertures are all located on a common circular shape.

10. The apparatus of claim 9 wherein the centerlines of the apertures are concentric with the circular shape of the body of ferrite material.

11. An RF circulator in combination with a RF integrated circuit, the RF integrated circuit having a plurality of RF waveguide or waveguide-like structures in or on said RF integrated circuit, the RF circulator comprising a body of ferrite material disposed on a metallic material disposed on or in said RF integrated circuit, the body of ferrite material extending away from the RF integrated circuit when disposed thereon, metallic material encapsulating a majority of an exterior surface of the body of ferrite material extending away from the RF integrated circuit, the encapsulating metallic material having a plurality of apertures therein adjacent said body of ferrite material which, in use, are in electromagnetic communication with said body of ferrite material and with said plurality of RF waveguide or waveguide-like structures.

12. The RF circulator in combination with a RF integrated circuit of claim 11 wherein a metallic cavity is formed at least in part by said metallic material disposed on or in said RF integrated circuit and said encapsulating metallic material, the body of ferrite material residing in said metallic cavity.

13. The RF circulator in combination with a RF integrated circuit of claim 11 wherein the body of ferrite material is in the form of a body of ferrite material comprising BaFeO and/or SrFeO.

14. A method of making an RF circulator on a RF integrated circuit substrate, the RF integrated circuit substrate having a plurality of RF waveguide or waveguide-like structures formed thereon or therein, the method comprising:

applying a first photoresist on said RF integrated circuit substrate, the photoresist being patterned to form a mold defining exterior sidewalls of magnetic material of the RF circulator to be formed;

immersing at least the mold with an aqueous solution containing magnetic nano (micro) particles, preferably of BaFeO or SrFeO material and setting a pH of the aqueous solution is set such that the surface charge on the magnetic nano (micro) particles causes repulsive forces between the particles thereby allowing the particles to be suspended in the solution;

controllably changing the pH of the aqueous solution to reduce the surface charge, therefore favoring particle agglomeration and deposition on said RF integrated circuit substrate;

removing the first photoresist;

applying a second photoresist on said RF integrated circuit substrate, the second photoresist being patterned to cover areas of said RF integrated circuit substrate adjacent the deposited magnetic nano (micro) particles on said RF integrated circuit substrate thereby exposing at least a majority of an exposed surface area of the deposited magnetic nano (micro) particles to further processing;

depositing an encapsulating metal on the exposed surface area of the deposited magnetic nano (micro) particles; and removing the second photoresist.

15. The method of claim 14 further including depositing a layer of metal prior to immersing at least the mold with said aqueous solution so that the magnetic nano (micro) particles are deposited on said layer of metal.

* * * * *